United States Patent [19]

Tarabocchia

[11] 3,748,975

[45] July 31, 1973

[54] APPARATUS FOR AND METHOD OF CORRECTING A DEFECTIVE PHOTOMASK

[75] Inventor: Martin Tarabocchia, Cliffside Park, N.J.

[73] Assignee: RCA Corporation, Princeton, N.J.

[22] Filed: Jan. 3, 1972

[21] Appl. No.: 214,921

[52] U.S. Cl. .................... 95/1 R, 96/27 E, 96/38.4, 96/45.2

[51] Int. Cl. .................... G03b

[58] Field of Search .................... 95/1 R; 96/38.4, 96/27 E, 45.2; 156/11

[56] References Cited

UNITED STATES PATENTS

| | | | |
|---|---|---|---|
| 3,460,448 | 8/1969 | Oliver | 95/1 R |
| 3,255,005 | 6/1966 | Green | 96/38.4 X |
| 3,625,728 | 12/1971 | Blome et al. | 96/38.4 X |
| 3,470,043 | 9/1969 | Whitfield | 156/11 X |
| 3,673,018 | 6/1972 | Dingwall | 95/1 R X |

OTHER PUBLICATIONS

Hallas, "Mask Aligning," IBM Technical Disclosure Bulletin; Vol. 11, No. 3, Aug. 1968, page 302.

*Primary Examiner*—Samuel S. Matthews
*Assistant Examiner*—Kenneth C. Hutchison
*Attorney*—Glenn H. Bruestle, H. Christoffersen and R. Williams

[57] ABSTRACT

A defect, in a metal photomask, that is either to be etched away, if opaque, or to be rendered opaque, if light-transmitting, is corrected, with the aid of novel apparatus, in a novel method of: (a) depositing a photoresist coating over a patterned film on one surface of the photomask, (b) focusing a projected shaped beam of light, incapable of exposing the photoresist coating, onto the photoresist coating, (c) aligning the focused beam, by viewing it from a surface of the photomask opposite to that which the photoresist coating is on, so that the light overlays the defect, (d) changing the characteristics of the beam of light so as to expose the photoresist coating, and (e) developing the photoresist coating. Depending upon the kind of photoresist coating used, the defect can now be either etched away or rendered opaque.

6 Claims, 5 Drawing Figures

APPARATUS FOR AND METHOD OF CORRECTING A DEFECTIVE PHOTOMASK

BACKGROUND OF THE INVENTION

This invention relates to apparatus for and a method of correcting defective photomasks. More particularly, the present invention relates to apparatus for and a method of correcting a defect in a metal photomask that is either to be etched away, if opaque, or to be rendered opaque, if light-transmitting. The novel apparatus and method are particularly useful in the manufacture of photomasks for making integrated circuits in the electronic arts.

A metal photomask is manufactured by depositing a thin film of metal, such as chromium or aluminum, on a transparent (substrate) sheet, such as glass or quartz, coating the film of metal with a photoresist coating, exposing a patterned region on the photoresist coating, developing the photoresist coating, and removing the metal in the unprotected areas of the film by etching, leaving a patterned film on the substrate.

In the manufacture of metal photomasks, certain visual defects may occur. These defects may comprise, for example, black spots or protrusions of metal film in areas that are to be transparent, or they may comprise holes or missing portions of metal film, in areas that are to be opaque. Since the manufacture of photomasks is a time-consuming and relatively expensive operation, it is many times more desirable to correct a defective photomask than to discard it and repeat the entire process.

SUMMARY OF THE INVENTION

The novel apparatus for correcting a defect in a photomask, wherein the photomask comprises a transparent substrate with a patterned film on one surface thereof, and wherein a photoresist coating has been applied over the patterned film, comprises means to focus a projected beam of light onto the photoresist coating, the beam of light being incapable of exposing the photoresist coating. The apparatus also comprises means to shape and align the beam of light, while viewing it through the transparent substrate, to cover (overlie) the defect, and means to change the characteristics of the beam of light to expose the photoresist coating when the beam of light is properly aligned over the defect.

The novel method of correcting a defective photomask comprises the steps of: (a) depositing a photoresist coating over a patterned film on one surface of a substrate of the photomask, (b) projecting a beam of light incapable of exposing the photoresist coating and focusing the beam on the photoresist coating, (c) aligning the focused light, while viewing it through the photomask, so that the focused light covers the defect, (d) changing the characteristics of the light beam to expose the photoresist coating, and (e) developing the photoresist coating. If the defect is of opaque material so that it is to be etched away, a positive photoresist is used. If the defect is light-transmitting, a negative photoresist coating is employed that is opaque to (ultraviolet) light with which the photomask is to be used ultimately.

DESCRIPTION OF THE PREFERRED EMBODIMENTS

Figure 1:
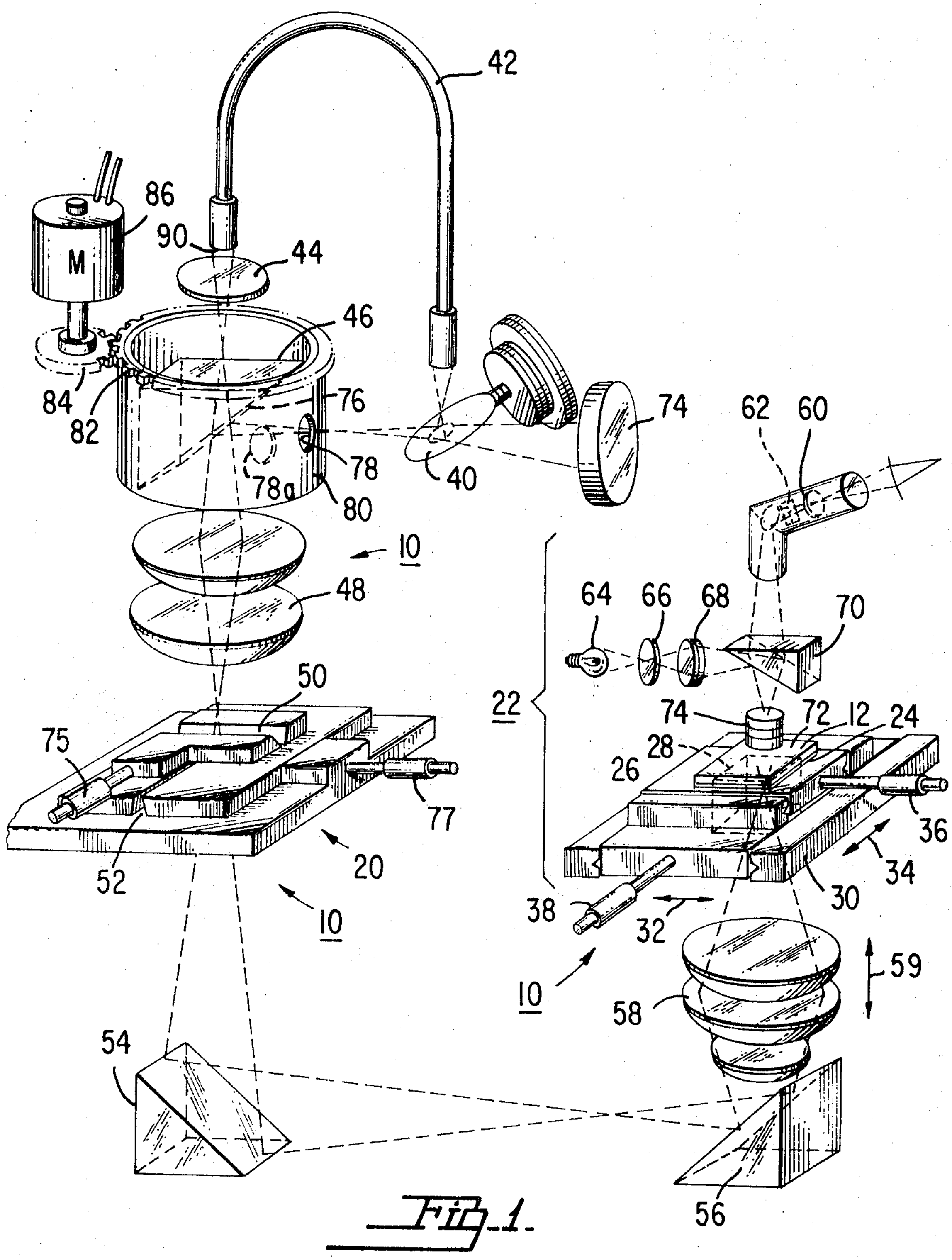
FIG. 1 is a schematic drawing of one embodiment of novel apparatus for correcting a defective photomask, in accordance with the novel method.

Referring now to FIG. 1 of the drawing, there is shown apparatus 10 for correcting a defective photomask 12. The photomask 12 may have one or more of the defects of the type illustrated in FIGS. 2, 3, 4, and 5 of the drawing.

Figure 2:
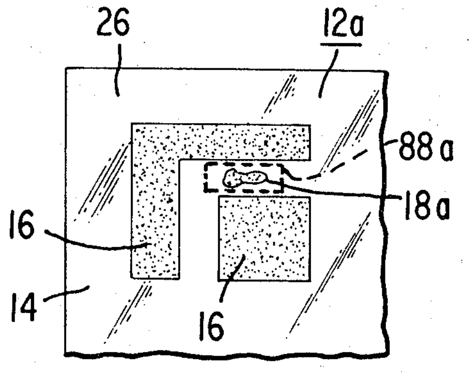
FIGS. 2, 3, 4, and 5 are fragmentary planar views of photomasks with different kinds of defects therein.

Referring to FIG. 2, there is shown a photomask 12a comprising a transparent substrate 14, such as a sheet of glass, quartz, or sapphire, for example, having a patterned film 16, such as a layer of chromium or aluminum, for example, formed on one surface 26 of the photomask 12*a*, as by photolithographic means well known in the integrated circuit electronic art. A defect 18*a* in the form of an extra unwanted deposit of the opaque material of the patterned film, is disposed in an area that should be transparent. Integrated circuits made with the aid of the photomask 12*a* may be defective unless the defect 18*a* is removed therefrom. The same reference numerals will be used to designate similar parts in FIGS. 2, 3, 4, and 5.

Figure 3:
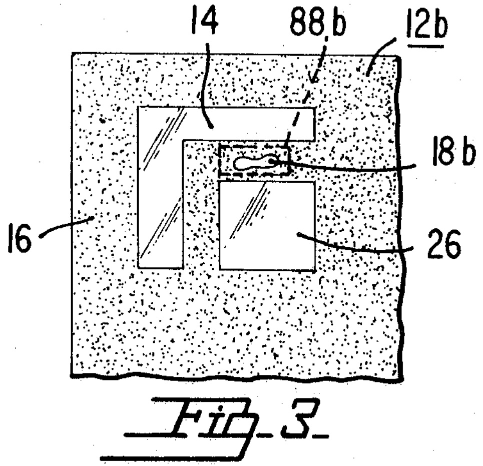

In FIG. 3, there is shown a photomask 12*b* wherein a defect 18*b* comprises an unwanted hole that should be opaque in the patterned film 16.

Figure 4:
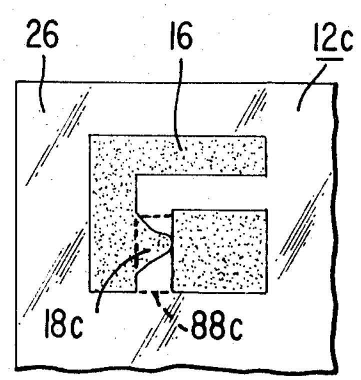

In FIG. 4, there is shown a photomask 12*c* wherein a defect 18*c* comprises an unwanted opaque protrusion from the patterned film 16.

Figure 5:
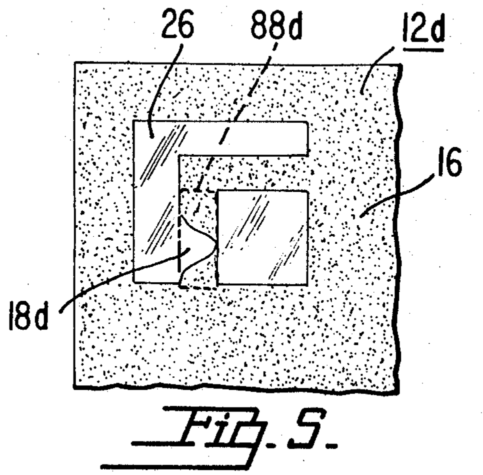

In FIG. 5, there is shown a photomask 12*d* wherein a defect 18*d* comprises an absence of opaque material from the patterned film 16. All of the aforementioned defects 18*a*–18*d* can be corrected by the novel method with the aid of the novel apparatus 10.

The apparatus 10 (FIG. 1) comprises broadly a light beam projection system 20 and a microscope viewing system 22.

The first step in correcting a defective photomask of the types discussed is to deposit a photoresist coating 24 over the patterned film 16 on the surface 26 of the photomask. The photomask 12 is positioned over an opening 28, shown as a dashed rectangle, in an adjustable X-Y stage, or adjustable X-Y table 30, adapted to be moved in either of two directions at right angles to each other, as indicated by the double-headed arrows 32 and 34, by control knobs 36 and 38, respectively, in a manner well known in the art. The photoresist coating 24 is placed directly over the opening 28 in the table 30 so that light projected upwardly through the X-Y table 30 can be focused directly upon the plane of the photoresist coating 24. If the defect in the photomask 12 is in the form of unwanted opaque material in an area that should otherwise be clear, such as either of the defects 18*a* or 18c in the photomasks 12*a* or 12*c*, respectively, the photoresist coating 24 should be a positive one, for the purpose hereinafter appearing. On the other hand, if the defect is in the form of either unwanted holes or missing film portionS in areas that should otherwise be opaque, as, for example, either of the defects 18*b* or 18*d* in the photomasks 12*b* or 12*d*, respectively, a suitable negative photoresist coating, such as a red-tinted, negative photoresist coating, is used, for the purposes hereinafter appearing.

The projection system 20 comprises means to focus a shaped beam of light onto the photoresist 24 adjacent the defect to be corrected. To this end, a source 40 of light to which the photoresist coating 12 is responsive, preferably a source of intense near ultraviolet light, such as a pin-point, high-pressure mercury arc lamp, is disposed so as to project a beam of light via a path comprising a fiber optics bundle 42, a blue filter 44, a (pellicle) beam splitter 46, a condenser lens assembly 48, beam shaping means providing two adjustable coplanar slits 50 and 52 disposed transversely with respect to each other, preferably at right angles to each other, prisms 54 and 56, and an adjustable objective lens assembly 58 adapted to be adjusted in the directions of the double-headed arrow 59. Instead of the two coplanar slits 50 and 52, the beam shaping means may be any suitably shaped aperture in an opaque sheet, depending upon the shape of the defect to be covered.

In the embodiment of the apparatus 10, the fiber optics bundle 42 is 0.25 inches in diameter and subtends 1.5 steradiams solid angle with the light source 40 (General Electric H110A4/T long arc mercury lamp), thereby attenuating the intensity of the light source 40 and allowing only about 12 per cent of the available light energy to be directed through the beam splitter 46. The blue filter 44 is a black light (ultraviolet) absorption filter (Corning 7–59), and the combined attenuation of light by the filter 44 and the beam splitter 46 is about 83 per cent. Only a little over 2 per cent of the available light energy passes through the adjustable coplanar slits 50 and 52. The light beam that is projected through the fiber optics bundle 42, the filter 44, and the beam splitter 46 is bright enough to illuminate the focused image of the coplanar slits 50 and 52 that is projected onto the photoresist coating 24 on the photomask 12, but it does not possess the characteristics of wavelength and and light intensity to expose the photoresist coating 24 under normal operating conditions, that is, within a reasonable time.

The microscope viewing system 22 comprises an eyepiece assembly 60 including position reference markings, such as a graduated scale 62, and a reflective illumination system. The reflective illumination system comprises a lamp 64, a green filter 66, a condenser lens 68, and a beam splitter 70, disposed to illuminate a relatively large area on the upper surface 72 of the photomask 12 through an objective lens assembly 74. The microscope viewing system 22 is used to view the beam of light, shaped by the adjustable coplanar slits 50 and 52, and focused upon the photoresist coating 24 by the adjustable objective lens assembly 58.

The photomask 12 is viewed by means of the green filtered relfective illumination provided by the lamp 64 and filter 66. Upon locating the defect in the photomask 12 at the center of the microscopic field with the aid of the adjustable table 30, the projected image of the coplanar slits 50 and 52 is focused onto the photoresist coating 24. The projected image of the coplanar slits 50 and 52 is adjusted, as by micrometers 75 and 77 in the beam shaping means to provide a rectangle of light that completely covers the defect to be corrected and is focused onto the photoresist coating 24 by adjusting the objective lens assembly 58. Since the defect area of the photomask 12 is illuminated by green light from the green filter 66, and the projected light image of the coplanar slits 50 and 52 is blue, because of the blue filter 44, good contrast viewing is obtained.

The light image of the coplanar slits 50 and 52 is visible through the microscope viewing system 22 only when viewing light-transparent areas of the photomask 12. The graduated scale 62, located in the eyepiece assembly 60, is used to align the projected (rectangular) light image of the coplanar slits 50 and 52 directly over the defect to be corrected when viewing opaque areas of the photomask 12, as will be hereinafter explained. Upon completion of the alignment, the exposure of the photoresist coating 24 can take place.

The mercury arc lamp of the light source 40, used for aligning the coplanar slits 50 and 52 with the defect to be corrected, is also used for exposing the photoresist coating 24. A reflector 74 is disposed to reflect light from the light source 40 back to the light source. The beam of light from the light source 40 is also directed to a reflective surface 76 of the beam splitter 46, through an opening 78 in a cylindrical shutter 80. The shutter 80 has an annular gear 82 fixed to its surface adjacent its upper end. A spur gear 84 is meshed with the annular gear 82 and adapted to be rotated by a motor 86 when the latter is energized. Thus, an image of the coplanar slits 50 and 52 can be projected upon the photoresist coating 24 by the light source 40 when the shutter 80 is positioned so that the light passes through the opening 78. When the light source 40 is used for an alignment beam, via the fiber optics bundle 42 and the blue filter 44, the shutter is rotated so that no light from the light source 40 can pass through the opening 78, as when the shutter is rotated so that the opening 78 is in a position shown by the dashed circle 78*a*.

The novel method will now be explained with the aid of the novel apparatus 10 for eliminating opaque spots and opaque protrusions from areas that are to be transparent in the photomask, as, for example, defects 18*a* and 18*c* in the photomasks 12*a* (FIG. 2) and 12*c* (FIG. 4), respectively. The surface 26 to which the patterned film 16 is adhered, including the patterned film 16 is coated uniformly with a positive photoresist coating 24. By a "positive photoresist coating" is meant one which after being exposed and developed remains where it has not been exposed. The shutter 80 is rotated by energizing the motor 86 so that the light source 40 does not pass through the opening 78 and, therefore, does not impinge upon the reflective surface 76 of the beam splitter 46. An alignment beam of light is now directed onto the photoresist coating 24 of the photomask 12, the photomask 12 having been placed on the adjustable table 30 over the opening 28 therein. The coplanar slits 50 and 52 are adjusted (shaped) so that the alignment beam that is focused upon the photoresist 24 by the objective lens assembly 58 provides a rectangular light image large enough to cover the defect to be removed. The observer now adjusts the adjustable table 30 by means of the adjustment controls 36 and 38 so that the projected image (rectangular area) of the coplanar slits 50 and 52 just covers the defect (18*a* or 18*c*). For example, the observer looking through the microscope viewing system 22 can observe and adjust the alignment beam so that a projected and focused light image 88*a* (illustrated by a dashed rectangle) of the coplanar slits 50 and 52 just covers the defect 18*a* of the photomask 12*a* as shown in FIG. 2. To remove the defect 18*c* in the photomask 12*c*, the projected and focused alignment beam projects a rectangular light image 88*c* of the coplanar slits 50 and 52, as shown in FIG. 4.

When properly aligned, the characteristics of the alignment beam are changed by increasing its intensity (and changing its wavelengths) so that it becomes an exposure beam. This is accomplished by rotating the shutter 80, by the motor 86 and gears 84 and 82, so that light from the light source 40 passes through the opening 78 in the shutter 80, and is reflected along the previous path of the alignment beam by reflection from the surface 76 of the beam splitter 46. The length of the beam of light between the light source 40 and the condenser lens assembly 48 is substantially equal to the distance between the light exit end 90 of the fiber optics bundle 42 and the condenser lens assembly 48 so that both the alignment beam and the exposure beam follows the same path to the photoresist coating 24 on the photomask 12.

The photoresist coating 24, when positive, is exposed by the exposure beam for a time depending upon the type of photoresist coating 24 used and developed with a suitable developer so as to remove the exposed portion. Thus, the portion of the photoresist coating 24 within the image 88a or 88*c* of photomasks 12*a* or 12*c*, respectively, is removed, thereby uncovering the defect 18*a* or 18*c* and leaving the rest of the patterned film 16 protected. The defects 18*a* or 18*c* can now be etched away by any suitable etchant known in the art, depending upon the type of material of which the defects 18*a* and 18*c* are composed. After the defect is removed, the rest of the photoresist coating 24 is removed by solutions well known in the art.

The removal of holes, that is, lack of opaque material, in the patterned film 16 as, for example, a defect 18*b* or 18*d* in the photomask 12*b* or 12*d*, respectively, will now be explained. The surface 26 to which the patterned film 16 is adhered, including the patterned film 16, is coated with a negative resist coating 24 that is tinted with a red dye which does not transmit ultraviolet light. The shutter 80 is disposed so that light from the light source 40 provides an alignment image 88*c* of the coplanar slits 50 and 52, via the fiber optics bundle 42 and the blue filter 44, focused onto the photoresist coating 24. The focused and adjustable shaped light image of the coplanar slits 50 and 52 is viewed (through a transparent portion of the photomask) through the microscope viewing system 22 and its location on the photoresist coating 24 is noted and referenced with respect to the graduated scale 62 in the eyepiece assembly 60. The table 30 is then adjusted so that the defect 18b or 18d of the photomask 12*b* or 12*d*, respectively, is included within the light image 88*b* or 88*d*, respectively, using the graduated scale 62 for accurate alignment, as shown in FIGS. 3 and 5.

When properly aligned, the shutter 80 is rotated, by energizing the motor 86, so that the light source 40 can project its light directly onto the surface 76 of the beam splitter 46, through the opening 78, and then along the same path taken by the alignment beam, thereby exposing the photoresist coating 24. The negative photoresist coating 24 is developed with a suitable developer, after it has been sufficiently exposed, so that all of the photoresist coating 24, with the exception of the exposed region, is cleaned away. The remaining red-tinted, developed, negative photoresist 24 is opaque to near ultraviolet light of the type used in conjunction with the photomasks 12*b* and 12*d*. Consequently, the corrected photomask 12 can be used, in a manufacturing process, to expose any photoresist with near ultraviolet light.

I claim:

1. Apparatus for correcting a defective photomask, said photomask comprising a transparent substrate having opposite surfaces, a patterned opaque film being on one of said opposite surfaces, and having a photoresist coating over said film, said apparatus comprising:

means to project a shaped beam of light, having characteristics such that it does not expose said photoresist coating, and to focus it on said photoresist coating, means to align said focused beam of light over a defect in said defective photomask when viewing said transparent substrate from the other of said opposite surfaces, and means for changing the characteristics of said beam of light so that it exposes said photoresist coating.

2. Apparatus for correcting a defective photomask as described in claim 1, wherein:

said means to project a shaped beam of light comprises a source of ultraviolet light, an ultraviolet absorption filter, and means to attenuate the intensity of said source between said source and said filter, whereby said beam of light comprises wavelengths and an intensity to which said photoresist coating is substantially insensitive.

3. Apparatus for correcting a defective photomask as described in claim 2, wherein:

said means to attenuate the intensity of said source comprises a fiber optic bundle.

4. Apparatus for correcting a defective photomask as described in claim 2, wherein:

said means to project a shaped beam of light also comprises adjustable means to provide a pair of transversely disposed adjustable slits in the path of said beam of light, whereby said beam of light can be focused on said photoresist coating as a rectangular light image.

5. Apparatus for correcting a defective photomask as described in claim 1, wherein:

said means to align said focused beam of light comprises a microscope viewing system having means to illuminate said other of said opposite surfaces of said photomask by reflective light of wavelengths substantially different from those of said beam of light which does not expose said photoresist coating, and an eyepiece lens assembly having reference markings.

6. Apparatus for correcting a defective photomask as described in claim 1, wherein:

said means for changing the characteristics of said beam of light comprises means for increasing the intensity of said beam and means for changing the wavelengths of said beam so that said photoresist coating is responsive to it, whereby to expose said photoresist coating.

* * * * *

65